(12) United States Patent
Ciszek et al.

(10) Patent No.: US 9,991,444 B2
(45) Date of Patent: Jun. 5, 2018

(54) SURFACE-MODIFIED ORGANIC SEMICONDUCTORS

(71) Applicant: LOYOLA UNIVERSITY OF CHICAGO, Chicago, IL (US)

(72) Inventors: Jacob W. Ciszek, Glenview, IL (US); Brittni A. Qualizza, Chicago, IL (US); Srividya Prasad, Mount Pleasant, MI (US)

(73) Assignee: LOYOLA UNIVERSITY OF CHICAGO, Chicago, IL (US)

( * ) Notice: Subject to any disclaimer, the term of this patent is extended or adjusted under 35 U.S.C. 154(b) by 853 days.

(21) Appl. No.: 14/476,901

(22) Filed: Sep. 4, 2014

(65) Prior Publication Data

US 2015/0060831 A1 Mar. 5, 2015

Related U.S. Application Data

(60) Provisional application No. 61/873,990, filed on Sep. 5, 2013.

(51) Int. Cl.
*H01L 51/00* (2006.01)
*H01L 51/05* (2006.01)

(52) U.S. Cl.
CPC ...... *H01L 51/0052* (2013.01); *H01L 51/0054* (2013.01); *H01L 51/0055* (2013.01); *H01L 51/0056* (2013.01); *H01L 51/0071* (2013.01); *H01L 51/0558* (2013.01)

(58) Field of Classification Search
None
See application file for complete search history.

(56) References Cited

U.S. PATENT DOCUMENTS

| | | | |
|---|---|---|---|
| 7,125,989 | B2 | 10/2006 | Afzali-Ardakani et al. |
| 7,820,653 | B2 | 10/2010 | Hu et al. |

(Continued)

OTHER PUBLICATIONS

Afzali et al., High-performance, solution-processed organic thin film transistors from a novel pentacene precursor, J. Am. Chem. Soc., 124(30):8812-3 (2002).

(Continued)

*Primary Examiner* — Alexandre F Ferre
*Assistant Examiner* — Elaine M Vazquez
(74) *Attorney, Agent, or Firm* — Marshall, Gerstein & Borun LLP

(57) ABSTRACT

Surface-modified organic semiconductors and methods for making surface-modified organic semiconductors are disclosed. More particularly, surface-modified thin films are provided, the surface-modified thin films comprising a first layer comprising a polyaromatic organic semiconductor and a surface layer in direct contact with the first layer, the surface layer comprising an addition reaction product of the polyaromatic organic semiconductor with, for example, a dienophile, wherein the first layer is substantially free of the addition reaction product of the organic semiconductor with the dienophile. Also provided are surface-modified single crystals comprising a core comprising a polyaromatic organic semiconductor and a coating in direct contact with the core, the coating comprising, for example, an addition reaction product of the polyaromatic organic semiconductor with a dienophile, wherein the core is substantially free of the addition reaction product of the organic semiconductor with the dienophile.

29 Claims, 1 Drawing Sheet

(56) References Cited

U.S. PATENT DOCUMENTS

| | | | | |
|---|---|---|---|---|
| 2003/0144562 | A1* | 7/2003 | Afzali-Ardakani | C07D 487/08 570/212 |
| 2008/0249309 | A1* | 10/2008 | Facchetti | C07D 471/06 546/37 |
| 2012/0108850 | A1* | 5/2012 | Nagata | C07C 17/16 568/309 |

OTHER PUBLICATIONS

Calhoun et al., Electronic functionalization of the surface of organic semiconductors with self-assembled monolayers, Nat. Mater., 7(1):84-9 (2008).

Ciszek, Diels-Alder reactions of organic semiconductor surfaces: a new electronic doping, Conférence au Département de chimie présentée conjointement avec le CERMA, Université Laval (Sep. 26, 2012) [Abstract].

Dong et al., High performance organic semiconductors for field-effect transistors, Chem. Commun., 46:5211-22 (2010).

Ellison et al., Surface potential mapping of SAM-functionalized organic semiconductors by Kelvin probe force microscopy, Adv. Mater., 23(4):502-7 (2011).

Katz, Recent advances in semiconductor performance and printing processes for organic transistor-based electronics, Chem. Mater., 16:4748-56 (2004).

Qualizza et al., Functionalization of organic semiconductor crystals via the Diels-Alder reaction, Chem. Commun. (Camb.), 49(40):4495-7 (2013).

* cited by examiner

SURFACE-MODIFIED ORGANIC SEMICONDUCTORS

CROSS-REFERENCE TO RELATED APPLICATIONS

This application claims the benefit of US. Provisional patent application No. 61/873,990, filed Sep. 5, 2014, incorporated herein by reference in its entirety.

STATEMENT OF GOVERNMENT INTEREST

This invention was made with government support under grant number CHE1056400 awarded by the National Science Foundation. The government has certain rights in the invention.

BACKGROUND

Field of the Invention

The invention relates generally to surface-modified organic semiconductors and to methods of preparing surface-modified organic semiconductors. More particularly, the invention relates to surface modification of organic semiconductors using addition reactions, such as Diels-Alder reactions, and to organic semiconductors having surfaces containing addition reaction products.

Brief Description of Related Technology

Materials comprising organic semiconductors are prone to several disadvantages, including a propensity to oxidize, degradation resulting from humidity, and the prevalence of trap states at the semiconductor/dielectric interface. Surface-modification of organic semiconductor materials may affect these and other properties, including the electronic properties (e.g., carrier density, carrier mobility, conductivity, and field-effect mobility) of the organic semiconductor materials.

For example, Calhoun et al. describe functionalization of the surface of organic semiconductors with self-assembled monolayers of perfluorinated alkyl silanes (*Nature Materials*, 7:84-89 (2008)). Further, Ellison et al. describe self-assembled monolayers of fluorinated and non-fluorinated alkyl silanes on rubrene single crystals (*Advanced Materials*, 23:502-507 (2011)). In both cases, the self-assembled monolayers are prepared from trichlorosilanes. Trichlorosilanes demonstrate several disadvantages, including a poor ability to generate uniform, regular, or well-defined films on surfaces. Additionally, due to the incompatibility of trichlorosilanes with numerous functional groups, the range of functional groups that can be appended to the trichlorosilanes is severely limited, thereby limiting the extent to which various physical and electronic properties of the organic semiconductors can be altered.

The present invention provides improved methods and compositions for surface modification of organic semiconductors.

SUMMARY

The invention provides a surface-modified thin film. The surface-modified thin film comprises (a) a first layer comprising a polyaromatic organic semiconductor and (b) a surface layer in direct contact with the first layer, the surface layer comprising an addition reaction product of the polyaromatic organic semiconductor with a compound of formula (II):

$$X=Y \quad (II),$$

wherein X and Y are independently selected from the group consisting of $CR^5R^6$, $NR^7$, O, S, and S=O, or X=Y is a 5- or 6-membered ring having at least one endocyclic double bond selected from the group consisting of a carbon-carbon double bond, a carbon-nitrogen double bond, and a nitrogen-nitrogen double bond; and $R^5$, $R^6$, and $R^7$ are independently selected from the group consisting of H, aryl, heteroaryl, alkyl, and an electron-withdrawing group. The first layer of the surface-modified thin film is substantially free of the addition reaction product of the organic semiconductor with the compound of formula (II).

The polyaromatic organic semiconductor is a fused aromatic ring system (e.g., a polynuclear aromatic ring system), either carbocyclic or heterocyclic. In some embodiments, the organic semiconductor is an acene. In other embodiments, the organic semiconductor is a phenacene. In still other embodiments, the organic semiconductor is a nitrogen atom-containing or a sulfur atom-containing analog of an acene or a phenacene.

In a related aspect, the invention provides a method of making surface-modified thin films. The method comprises providing a thin film comprising a polyaromatic organic semiconductor; and reacting a surface of the thin film with a compound of formula (II) to form a surface-modified thin film.

In another related aspect, the invention provides a surface-modified single crystal. The surface-modified single crystal comprises (a) a core comprising a polyaromatic organic semiconductor and (b) a coating in direct contact with the core, the coating comprising an addition reaction product of the organic semiconductor with a compound of formula (II):

$$X=Y \quad (II),$$

wherein X and Y are independently selected from the group consisting of $CR^5R^6$, $NR^7$, O, S, and S=O, or X=Y is a 5- or 6-membered ring having at least one endocyclic double bond selected from the group consisting of a carbon-carbon double bond, a carbon-nitrogen double bond, and a nitrogen-nitrogen double bond; and $R^5$, $R^6$, and $R^7$ are independently selected from the group consisting of H, aryl, heteroaryl, alkyl, and an electron-withdrawing group. The core of the surface-modified single crystal is substantially free of the addition reaction product of the organic semiconductor with the compound of formula (II).

In a related aspect, the invention provides a method of making surface-modified single crystals. The method comprises providing a single crystal comprising a polyaromatic organic semiconductor; and reacting a surface of the single crystal with a compound of formula (II) to form a surface-modified single crystal.

Further aspects of the invention may become apparent to those skilled in the art from a review of the following detailed description, taken in conjunction with the appended claims. While the invention is susceptible of embodiments in various forms, described hereinafter are specific embodiments of the invention with the understanding that the disclosure is illustrative, and is not intended to limit the invention to specific embodiments described herein.

DETAILED DESCRIPTION

Figure 1:
FIG. 1 is a schematic drawing of an unmodified thin film or unmodified single crystal 1.

The invention provides a surface-modified thin film comprising a first layer comprising a polyaromatic organic semiconductor and a surface layer in direct contact with the first layer, the surface layer comprising an addition reaction product of the organic semiconductor with a compound of formula (II), such as a dienophile, wherein the first layer is substantially free of the addition reaction product of the organic semiconductor with the compound of formula (II).

The invention further provides a method of making a surface-modified thin film comprising providing a thin film comprising a polyaromatic organic semiconductor and reacting a surface of the thin film with a compound of formula (II) to form a surface-modified thin film.

The invention provides a surface-modified single crystal comprising a core comprising a polyaromatic organic semiconductor and a coating in direct contact with the core, the coating comprising an addition reaction product of the organic semiconductor with a compound of formula (II) wherein the core is substantially free of the addition reaction product of the organic semiconductor with the compound of formula (II).

The invention further provides a method of making a surface-modified single crystal comprising providing a single crystal comprising a polyaromatic organic semiconductor and reacting a surface of the single crystal with a compound of formula (II) to form a surface-modified single crystal.

Unless defined otherwise, all technical and scientific terms used herein have the same meaning as commonly understood by one of ordinary skill in the art to which this invention pertains.

Ranges may be expressed herein as from "about" or "approximately" one particular value and/or to "about" or "approximately" another particular value. When such a range is expressed, another embodiment according to the invention includes from the one particular value and/or to the other particular value. Similarly, when particular values are expressed as approximations, by use of antecedents such as "about," "at least about," or "less than about," it will be understood that the particular value forms another embodiment.

The invention is described in further detail below. Section headings are for convenience of reading and not intended to be limiting per se.

Surface-Modified Organic Semiconductors

The surface-modified thin films and surface-modified single crystals of the invention include a polyaromatic organic semiconductor. The polyaromatic organic semiconductor comprises at least three and up to nine fused aromatic rings. The polyaromatic organic semiconductor can be a fused polyaromatic hydrocarbon or a fused polyaromatic heterocyclic ring system. The organic semiconductor is capable of undergoing an addition reaction, such as a cycloaddition reaction, with a compound of formula (II), e.g., reacting with a dienophile via a Diels-Alder reaction, to form an addition product of the organic semiconductor with the compound of formula (II).

In one embodiment, the organic semiconductor is an acene represented by formula (I):

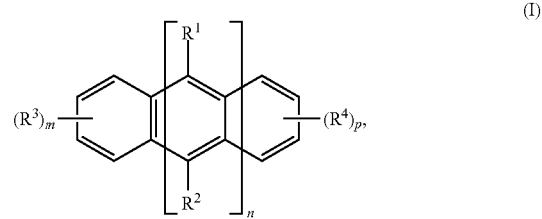

wherein each $R^1$ and $R^2$ is, independently, selected from the group consisting of H, aryl, heteroaryl, halo, hydroxyl, alkoxy, alkynl, acetyl, cyano, amido, nitro, amino, alkylamino, formyl, benzo, naphtho, acetoxy, thiophenyl, alkylthio, cycloalkyl, and alkyl; n is selected from the group consisting of 1, 2, 3, 4, 5, 6, and 7; m and p are independently selected from the group consisting of 0, 1, 2, 3, and 4; and each $R^3$ and $R^4$ is independently selected from the group consisting of aryl, heteroaryl, halo, hydroxyl, alkoxy, alkynl, acetyl, cyano, amido, nitro, amino, alkylamino, formyl, benzo, naphtho, acetoxy, thiophenyl, alkylthio, cycloalkyl, and alkyl.

In another embodiment, the organic semiconductor is a phenacene represented by formula (VIII) or formula (IX):

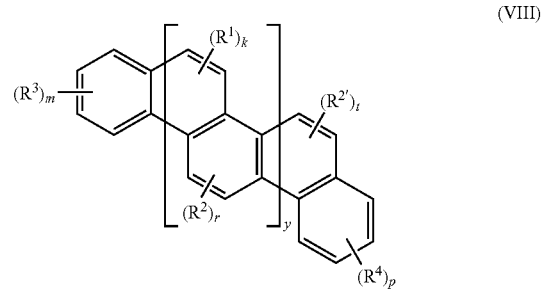

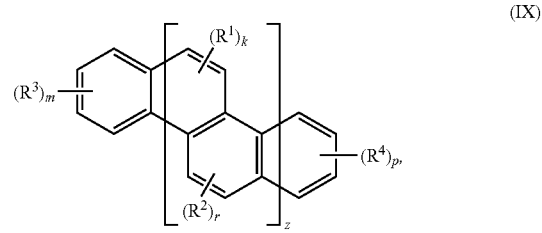

wherein each $R^1$, $R^2$, $R^{2'}$, $R^3$, and $R^4$ is, independently, selected from the group consisting of aryl, heteroaryl, halo, hydroxyl, alkoxy, alkynl, acetyl, cyano, amido, nitro, amino, alkylamino, formyl, benzo, naphtho, acetoxy, thiophenyl, alkylthio, cycloalkyl, and alkyl; y is selected from the group consisting of 0, 1, 2, and 3; z is selected from the group consisting of 1, 2, and 3; m and p are independently selected from the group consisting of 0, 1, 2, 3, and 4; and k, r, and t are independently selected from the group consisting of 0, 1, and 2. Nonlimiting examples of phenacenes include, but are not limited to, phenanthrene, termed herein [3] phenacene, and [b] phenacenes, such as [4] phenacene through [7] phenacene:

| [b] Phenacene | Common name | Structure |
|---|---|---|
| [3] phenacene | Phenanthrene |  |
| [4] phenacene | Chrysene | 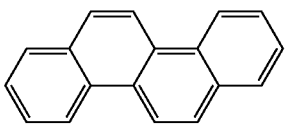 |
| [5] phenacene | Picene | 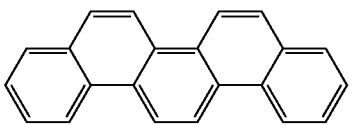 |
| [6] phenacene | | 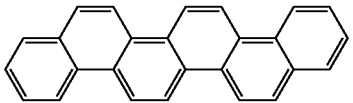 |
| [7] phenacene | | 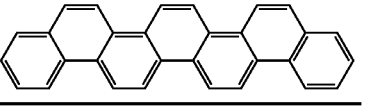 |

In another embodiment, the organic semiconductor is a heterocyclic analog of an acene or phenacene, such as a hetereocyclic analog of the above-disclosed acenes and phenacenes. In this embodiment, 1, 2, 3, 4, 5, 6, 7, 8, or 9 aromatic rings of the acene or phenacene are replaced by a heteroaromatic ring. In some aspects of this embodiment, the heterocyclic analog of an acene or phenacene has 1, 2, 3, 4, 5, 6, 7, 8, or 9 nitrogen atoms and/or 1, 2, 3, 4, 5, 6, 7, 8, or 9 sulfur atoms in the ring system. In this embodiment, the acene and phenacene analogs are capable of undergoing an addition reaction, such as a cycloaddition reaction, with a compound of formula (II). Nonlimiting examples of heterocyclic acene and phenacene analogs include, but are not limited to, optionally substituted phenanthrolines (e.g., 1,5-, 1,7-, 1,8-, 1,10-, 4,5-, and 4,7-), optionally substituted quinolines (e.g., optionally substituted benzoquinoline), optionally substituted pentathienoacene, and mixtures thereof.

As used herein, the term "alkyl" refers to straight chained and branched saturated $C_{1-10}$ hydrocarbon groups, nonlimiting examples of which include methyl, ethyl, and straight chain and branched propyl and butyl groups. Alkyl groups optionally can be substituted, for example, with one or more hydroxy (—OH), oxo (=O), halo (—F, —Cl, —Br, or —I), —CF₃, aryl, heteroaryl, cycloalkyl, heterocycloalkyl, alkoxy, amino, alkylamino, nitro (—NO₂), and thio (—SH) groups or a combination thereof.

As used herein, the term "aryl" refers to a monocyclic or polycyclic aromatic group, preferably a monocyclic or bicyclic aromatic group, e.g., phenyl or naphthyl. Unless otherwise indicated, an aryl group can be unsubstituted or substituted with one or more, and in particular one to four groups independently selected from, for example, halo, alkyl, alkenyl, —OCF₃, —CF₃, —NO₂, —CN, —OH, —SH, alkoxy, amino, alkylamino, —CO₂H, —CO₂-alkyl, aryl, and heteroaryl or a combination thereof. Exemplary aryl groups include, but are not limited to, phenyl, naphthyl, tetrahydronaphthyl, chlorophenyl, methylphenyl, methoxyphenyl, trifluoromethylphenyl, nitrophenyl, 2,4-methoxychlorophenyl, and the like.

As used herein, the term "heteroaryl" refers to a monocyclic or bicyclic ring system containing one or more aromatic rings and containing at least one nitrogen, oxygen, or sulfur atom in an aromatic ring. Unless otherwise indicated, a heteroaryl group can be unsubstituted or substituted with one or more, and in particular one to four, substituents selected from, for example, halo, alkyl, alkenyl, —OCF₃, —CF₃, —NO₂, —CN, —NC, —OH, alkoxy, amino, alkylamino, —CO₂H, —CO₂-alkyl, aryl, and heteroaryl. Examples of heteroaryl groups include, but are not limited to, thienyl, furyl, pyridyl, oxazolyl, quinolyl, thiophenyl, isoquinolyl, indolyl, triazinyl, triazolyl, isothiazolyl, isoxazolyl, imidazolyl, benzothiazolyl, pyrazinyl, pyrimidinyl, thiazolyl, and thiadiazolyl.

As used herein, the term "cycloalkyl" refers to an optionally substituted $C_{3-8}$ cyclic saturated hydrocarbon, for example, but not limited to, cyclopropyl, cyclobutyl, cyclopentyl, and cyclohexyl.

The term "alkenyl" is defined identically as "alkyl," except for containing a carbon-carbon double bond, e.g., ethenyl, propenyl, and butenyl.

The term "alkynyl" is defined identically as alkyl, except for containing a carbon-carbon triple bond, e.g., ethynyl.

As used herein, the term "halo" is defined as fluoro, chloro, bromo, and iodo.

The term "hydroxyl" is defined as —OH.

The term "alkoxy" is defined as —OR, wherein R is alkyl (e.g., $C_{1-4}$alkyl).

The term "amino" is defined as —NH₂, and the term "alkylamino" is defined as —NR₂, wherein at least one R is alkyl (e.g., $C_{1-4}$alkyl) and the second R is alkyl (e.g., $C_{1-4}$alkyl) or hydrogen.

The term "nitro" is defined as —NO₂.

The term "cyano" is defined as —CN.

The term "trifluoromethyl" is defined as —CF₃.

The term "trifluoromethoxy" is defined as —OCF₃.

The term "amido" is defined as —C(=O)NH₂.

The term "formyl" is defined as —C(=O)H.

The term "alkylthio" is defined as —SR, wherein R is alkyl (e.g., $C_{1-4}$alkyl).

The term "thiophenyl" is defined as —SC₆H₅.

The term "acetyl" is defined as —C(=O)CH₃.

$R^1$, $R^2$, $R^{2'}$, $R^3$, and $R^4$ aryl groups include, for example, $C_6$-$C_{10}$ aryl groups, such as phenyl and naphthyl. $R^1$, $R^2$, $R^{2'}$, $R^3$, and $R^4$ heteroaryl groups include, for example, $C_5$-$C_9$ heteroaryl groups, such as pyridinyl and indolyl. $R^1$, $R^2$, $R^{2'}$, $R^3$, and $R^4$ alkyl groups include, for example, $C_1$-$C_{10}$ alkyl groups, $C_1$-$C_6$ alkyl groups, and/or $C_1$-$C_4$ alkyl groups, such as methyl, ethyl, propyl, butyl, pentyl, hexyl, heptyl, octyl, nonyl, and decyl.

Suitable organic semiconductors of formula (I) include acenes, such as anthracene, tetracene, pentacene, hexacene, heptacene, octacene, rubrene, and mixtures thereof.

The surface-modified thin films and surface-modified single crystals of the invention include an addition reaction product of the polyaromatic organic semiconductor with a compound represented by formula (II):

wherein X and Y are, independently, selected from the group consisting of $CR^5R^6$, $NR^7$, O, S, and S=O, or X=Y is a 5- or 6-membered ring having at least one endocyclic double bond selected from the group consisting of a carbon-carbon double bond, a carbon-nitrogen double bond, and a nitrogen-nitrogen double bond; and $R^5$, $R^6$, and $R^7$ are, independently, selected from the group consisting of H, aryl, heteroaryl, alkyl, and an electron-withdrawing group.

$R^5$, $R^6$, and $R^7$ electron withdrawing groups include any functional group that removes electron density from a conjugated system (for example, via resonance and/or inductive electron withdrawal) including, but not limited to, F, Cl, Br, I, C(=O)R, C(=O)OR, C(=O)Cl, C(=O)$NR_2$, $CF_3$, C≡N, $SO_2R$, $SO_3R$, $NR_3^+$, and $NO_2$, wherein each R is selected from the group consisting of H, aryl, heteroaryl, and alkyl. R, $R^5$, $R^6$, and $R^7$ aryl groups include, for example, $C_6$-$C_{10}$ aryl groups, such as phenyl and naphthyl. R, $R^5$, $R^6$, and $R^7$ heteroaryl groups include, for example, $C_5$-$C_9$ heteroaryl groups, such as pyridinyl and indolyl. R, $R^5$, $R^6$, and $R^7$ alkyl groups include, for example, $C_1$-$C_{10}$ alkyl groups, $C_1$-$C_6$ alkyl groups, and/or $C_1$-$C_4$ alkyl groups, such as methyl, ethyl, propyl, butyl, pentyl, hexyl, heptyl, octyl, nonyl, and decyl.

Formula (II) includes compounds wherein both X and Y are $CR^5R^6$. Such compounds include two $R^5$ groups, which may be the same or different, and two $R^6$ groups, which may be the same or different. Formula (II) includes compounds wherein X and Y are $CR^5R^6$ and at least one $R^5$ is an electron-withdrawing group. Formula (II) also includes compounds wherein X and Y are $CR^5R^6$ and one, two, three, and/or four of the $R^5$ and/or $R^6$ groups are electron-withdrawing groups, which may be the same or different.

Formula (II) includes compounds wherein Y is $NR^7$ and $R^7$ is selected from the group consisting of H, aryl, heteroaryl, and alkyl. Formula (II) also includes compounds wherein Y is $NR^7$ and $R^7$ is an electron-withdrawing group. Formula (II) includes compounds wherein both X and Y are $NR^7$ and one or both of the $R^7$ groups are electron-withdrawing groups, which may be the same or different. Formula (II) includes compounds wherein X is $CR^5R^6$ and Y is $NR^7$ and one, two, and/or three of the $R^5$, $R^6$, and/or $R^7$ groups are electron-withdrawing groups, which may be the same or different.

Formula (II) includes 5- or 6-membered rings having at least one endocyclic double bond. Formula (II) includes compounds of formula (III) and formula (IV):

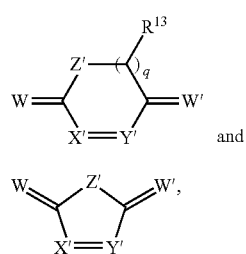

(III)

and (IV)

wherein X' and Y' are, independently, selected from the group consisting of $CR^8$ and N; Z' is selected from the group consisting of $CR^9R^{10}$, $NR^{11}$, O, S, S=O, and $SO_2$; W and W' are independently selected from the group consisting of O and $NR^{12}$; q is 0 or 1; $R^8$ is selected from the group consisting of H, aryl, heteroaryl, alkyl, and an electron-withdrawing group; and $R^9$, $R^{10}$, $R^{11}$, $R^{12}$, and $R^{13}$ are, independently, selected from the group consisting of H, aryl, heteroaryl, and alkyl.

$R^8$ electron withdrawing groups include any functional group that removes electron density from a conjugated system (for example, via resonance and/or inductive electron withdrawal) including, but not limited to, F, Cl, Br, I, C(=O)R, C(=O)OR, C(=O)Cl, C(=O)$NR_2$, $CF_3$, C≡N, $SO_2R$, $SO_3R$, $NR_3^+$, and $NO_2$, wherein each R is selected from the group consisting of H, aryl, heteroaryl, and alkyl. R, $R^8$, $R^9$, $R^{10}$, $R^{11}$, $R^{12}$, and $R^{13}$ aryl groups include, for example, $C_6$-$C_{10}$ aryl groups, such as phenyl and naphthyl. R, $R^8$, $R^9$, $R^{10}$, $R^{11}$, $R^{12}$, and $R^{13}$ heteroaryl groups include, for example, $C_5$-$C_9$ heteroaryl groups, such as pyridinyl and indolyl. R, $R^8$, $R^9$, $R^{10}$, $R^{11}$, $R^{12}$, and $R^{13}$ alkyl groups include, for example, $C_1$-$C_{10}$ alkyl groups, $C_1$-$C_6$ alkyl groups, and/or $C_1$-$C_4$ alkyl groups, such as methyl, ethyl, propyl, butyl, pentyl, hexyl, heptyl, octyl, nonyl, and decyl.

Exemplary compounds of formula (II) include, but are not limited to:

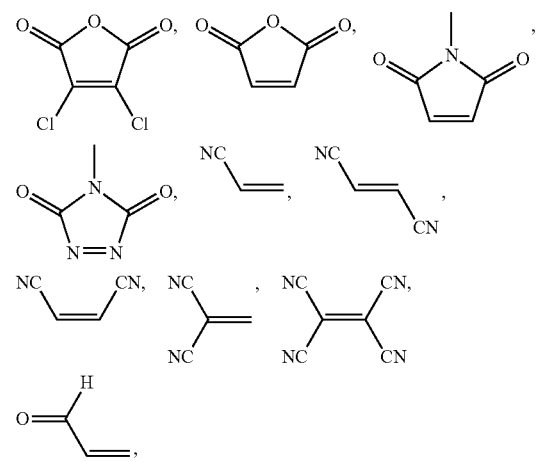

and mixtures thereof.

The surface-modified thin films and surface-modified single crystals include an addition reaction product of the polyaromatic organic semiconductor with a compound of formula (II). The addition reaction products are the result of a cycloaddition reaction of the polyaromatic organic semiconductor with the compound of formula (II). Suitable addition reaction products include the Diels-Alder reaction products of tetracene with the dienophile of formula (II). The Diels-Alder reaction of tetracene with the dienophile of formula (II) occurs preferentially at the 5,12-position of tetracene to generate the reaction product represented by formula (V):

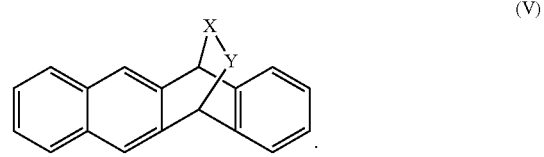

(V)

The dienophile of formula (II) also can react with tetracene at the 1,4-position. Suitable Diels-Alder reaction products also include the Diels-Alder reaction products of pentacene with the dienophile of formula (II). The Diels-Alder reaction of pentacene with the dienophile of formula (II) occurs preferentially at the 6,13-position of pentacene to generate the reaction product represented by formula (VI):

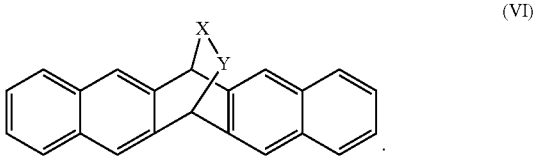

(VI)

The dienophile of formula (II) also can react with pentacene at the 1,4- and 5,14-positions. Suitable Diels-Alder reaction products further include the Diels-Alder reaction products of rubrene with the dienophile of formula (II). The Diels-Alder reaction of rubrene with the dienophile of formula (II) occurs preferentially at the unsubstituted 1,4-position of rubrene to generate the reaction product represented by formula (VII):

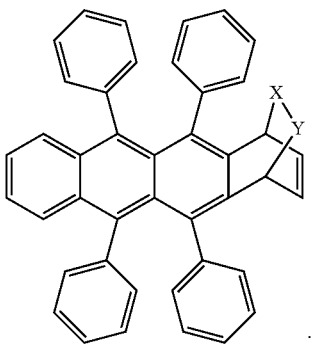

(VII)

The surface-modified thin films described herein are prepared by providing a thin film comprising an organic semiconductor and reacting a surface of the thin film with a compound of formula (II) to form a surface-modified thin film. The unmodified thin film (or layer) comprising a polyaromatic organic semiconductor generally is substantially free of the addition reaction product of the polyaromatic organic semiconductor with the compound of formula (II). In some embodiments, the compound of formula (II) for the reaction is provided in the vapor phase. In some embodiments, the compound of formula (II) for the reaction is provided in a condensed phase such as in a liquid phase or as a solution. The reaction of the polyaromatic organic semiconductor with the compound of formula (II) is carried out under conditions effective to obtain an addition reaction product of the polyaromatic organic semiconductor with the compound of formula (II). For example, the reaction is carried out at a temperature and pressure sufficient to obtain an addition reaction product of the polyaromatic organic semiconductor with the compound of formula (II). Exemplary reaction temperatures include, but are not limited to, at least about 0° C., at least about 10° C., at least about 20° C., at least about 30° C., at least about 40° C., at least about 50° C., at least about 60° C., at least about 70° C., at least about 80° C., less than about 150° C., less than about 140° C., less than about 130° C., less than about 120° C., less than about 110° C., less than about 100° C., and/or less than about 90° C. Exemplary reaction pressures include, but are not limited to, about 20 kbar or less, about 15 kbar or less, about 10 kbar or less, about 5 kbar or less, about 1 kbar or less, about 0.5 kbar or less, about 0.1 kbar or less, about 0.05 kbar or less, about 0.01 kbar or less, about 0.005 kbar or less, about 0.002 kbar or less, about 760 Torr or less, about 500 Torr or less, about 300 Torr or less, about 200 Torr or less, about 100 Torr or less, about 50 Torr or less, about 25 Torr or less, about 10 Torr or less, about 5 Torr or less, about 3 Torr or less, about 2 Torr or less, about 1 Torr or less, about 0.5 Torr or less, about 0.3 Torr or less, about 0.2 Torr or less, about 0.1 Torr or less, at least about 0.001 Torr, at least about 0.005 Torr, at least about 0.01 Torr, at least about 0.05 Torr, and/or at least about 0.1 Torr. Optionally, additional components including, but not limited to, solvents, catalysts, and the like can be included in the reaction mixture.

Reacting a surface of a thin film comprising a polyaromatic organic semiconductor with a compound of formula (II) results in a thin film having a modified surface. The modified surface comprises the addition reaction product of the polyaromatic organic semiconductor with the compound of formula (II), while the non-surface regions of the polyaromatic organic semiconductor remain unmodified. Thus, the surface-modified thin films have a first layer comprising a polyaromatic organic semiconductor that is substantially free of the addition reaction product of the polyaromatic organic semiconductor with the compound of formula (II), and a surface layer in direct contact with the first layer, the surface layer comprising an addition reaction product of the polyaromatic organic semiconductor with a compound of formula (II).

Figure 2:
FIG. 2 is a schematic drawing of a surface-modified thin film or surface-modified single crystal having a first layer or core 1 and a second surface layer or coating 2 in direct in direct contact with the first layer or core 1.

The surface-modified thin films generally have an average thickness of about 0.5 nm to about 10 microns, for example, about 1 nm to about 1 micron, about 2 nm to about 500 nm, about 3 nm to about 20 nm, about 5 nm to about 10 nm, and/or about 10 nm to about 50 nm. The surface layer 2 (FIG. 2) of the surface-modified thin films generally has an average thickness of about 0.5 nm to about 100 nm, for example, about 0.5 nm to about 70 nm, about 0.5 nm to about 50 nm, about 1 nm to about 50 nm, about 1 nm to about 30 nm, and/or about 1 nm to about 10 nm.

The surface-modified single crystals described herein are prepared by providing a single crystal comprising a polyaromatic organic semiconductor and reacting a surface of the single crystal with a compound of formula (II) to form a surface-modified single crystal. The unmodified single crystal (or core) comprising a polyaromatic organic semiconductor generally is substantially free of the addition reaction product of the polyaromatic organic semiconductor with the compound of formula (II). In some embodiments, the compound of formula (II) for the reaction is provided in the vapor phase. In some embodiments, the compound of formula (II) for the reaction is provided in a condensed phase such as in a liquid phase or as a solution. The reaction of the polyaromatic organic semiconductor with the compound of formula (II) is carried out under conditions effective to obtain an addition reaction product, such as a Diels-Alder reaction product, of the polyaromatic organic semiconductor with the compound of formula (II). For example, the reaction is carried out at a temperature and pressure sufficient to obtain an addition reaction product of the polyaromatic organic semiconductor with the compound of formula (II). Exemplary reaction temperatures include, but are not limited to, at least about 0° C., at least about 10° C., at least about 20° C., at least about 30° C., at least about 40° C., at least about 50° C., at least about 60° C., at least about 70° C., at least about 80° C., less than about 150° C., less than about 140° C., less than about 130° C., less than about 120° C., less than about 110° C., less than about 100° C., and/or less than about 90° C. Exemplary reaction pressures include, but are not limited to, about 20 kbar or less, about 15 kbar or less, about 10 kbar or less, about 5 kbar or less, about 1 kbar or less, about 0.5 kbar or less, about 0.1 kbar or less, about 0.05 kbar or less, about 0.01 kbar or less, about 0.005 kbar or less, about 0.002 kbar or less, about 760 Torr or less, about 500 Torr or less, about 300 Torr or less, about 200 Torr or less, about 100 Torr or less, about 50 Torr or less, about 25 Torr or less, about 10 Torr or less, about 5 Torr or less, about 3 Torr or less, about 2 Torr or less, about 1 Torr or less, about 0.5 Torr or less, about 0.3 Torr or less, about 0.2 Torr or less, about 0.1 Torr or less, at least about 0.001 Torr, at least about 0.005 Torr, at least about 0.01 Torr, at least about 0.05 Torr, and/or at least about 0.1 Torr Optionally, additional components including, but not limited to, solvents, catalysts, and the like can be included in the reaction mixture.

Reacting a surface of a single crystal comprising a polyaromatic organic semiconductor with a compound of formula (II) results in single crystal having a modified surface. The modified surface comprises the addition reaction product of the polyaromatic organic semiconductor with the compound of formula (II), while the non-surface regions of the polyaromatic organic semiconductor remain unmodified. Thus, the surface-modified single crystals have a core comprising a polyaromatic organic semiconductor that is substantially free of the addition reaction product of the organic semiconductor with the compound of formula (II), and a coating in direct contact with the core, the coating comprising an addition reaction product of the organic semiconductor with a compound of formula (II).

As used herein, the term "substantially free of the addition reaction product" refers to a layer or a single crystal (or a core of a single crystal) that contains less than about 10% of the specified addition reaction product, for example, less than about 9%, less than about 8%, less than about 7%, less than about 6%, less than about 5%, less than about 4%, less than about 3%, less than about 2%, less than about 1%, less than about 0.9%, less than about 0.8%, less than about 0.7%, less than about 0.6%, less than about 0.5%, less than about 0.4%, less than about 0.3%, less than about 0.2%, less than about 0.1%, less than about 0.05%, and/or less than about 0.01% of the specified addition reaction product.

As used herein, a layer of a thin film "in direct contact with" another layer refers to a thin film structure in which no intervening layers are present between the specified layers. As used herein, a core of a single crystal "in direct contact with" a coating refers to a single crystal structure in which no intervening coatings are present between the specified coating and the core.

The surface-modified thin films and surface-modified single crystals can be present on, carried by, and/or adhered to a substrate. For example, suitable substrates include, but are not limited to, plastics, glass, metals, metal oxides, semiconductors, ceramics, elastomers, and combinations thereof. The surface-modified thin films and surface-modified single crystals also can be present as the top layer on a multilayer stack.

The methods disclosed herein for preparing surface-modified thin films and surface-modified single crystals adjust the electronic properties of the initial (i.e., unmodified) polyaromatic organic semiconductor. For example, the methods provide surface-modified thin films and surface-modified single crystals having increased conductivity compared to the initial unmodified thin film or single crystal comprising a polyaromatic organic semiconductor. Further, the methods disclosed herein for preparing surface-modified thin films and surface-modified single crystals adjust the surface energy of the initial (i.e., unmodified) polyaromatic organic semiconductor. For example, the methods provide surface-modified thin films and surface-modified single crystals having increased surface energy compared to the initial unmodified thin film or single crystal comprising a polyaromatic organic semiconductor. Such surface-modified thin films and surface-modified single crystals demonstrate decreased contact angles and improved adhesiveness and wettability.

Thin Films

Thin films (or layers) comprising a polyaromatic organic semiconductor that generally are substantially free of the addition reaction product of the polyaromatic organic semiconductor with the compound of formula (II) can be prepared by any means known to one of ordinary skill in the art. For example, unmodified thin films (or layers) can be prepared by applying a solution of the polyaromatic organic semiconductor in a suitable solvent to a substrate or multilayer stack, and removing the solvent, thereby depositing the polyaromatic organic semiconductor on the substrate or multilayer stack, and forming a thin film comprising the polyaromatic organic semiconductor on the substrate or multilayer stack. Suitable methods for removing the solvent include, but are not limited to, evaporation and lyophilization.

Further exemplary methods for preparing unmodified thin films (or layers) include physical vapor deposition, chemical vapor deposition, spin coating, and printing (e.g., solution printing, such as inkjet printing and microcontact printing, and dry transfer printing).

Single Crystals

Single crystals (or single crystal cores) comprising a polyaromatic organic semiconductor that generally are substantially free of the addition reaction product of the polyaromatic organic semiconductor with the compound of formula (II) can be prepared by any means known to one of ordinary skill in the art. For example, uncoated single crystals (or single crystal cores) can be grown using physical vapor transport in an inert atmosphere in a horizontal tube furnace. Optionally, single crystals can be grown directly on a substrate or multilayer stack.

The surface-modified organic semiconductors in accordance with the present invention can be better understood in light of the following examples, which are merely intended to illustrate the surface-modified organic semiconductors and are not meant to limit the scope thereof in any way.

EXAMPLES

Example 1

Surface Functionalization of Tetracene Single Crystals

Single crystals of tetracene were grown using physical vapor transport in a horizontal quartz tube furnace under a stream of argon. Growth occurred over 16-24 hours in the dark at atmospheric pressure with an argon flow rate of 40-45 mL/min. Crystals were either collected off the furnace walls as free crystals or grown directly on gold-coated glass slides. If crystals were removed more than one hour before analysis, they were stored in a nitrogen filled glovebox or a vacuum chamber in the dark.

In five separate reactions, the surface of a tetracene single crystal was functionalized (i.e., the tetracene single crystal was surface-modified) by Diels-Alder reaction with one of the following dienophiles: 2,3-dichloromaleic anhydride, maleic anhydride, N-methylmaleimide, fumarodinitrile, and tetracyanoethylene. The dienophiles represent different relative reactivities including highly activated olefins (e.g., tetracyanoethylene), moderately activated olefins (e.g., 2,3- dichloromaleic anhydride, maleic anhydride, and N-methylmaleimide), and weakly activated olefins (e.g., fumarodinitrile). Each reaction was performed in a Schlenk round bottom flask equipped with a glass hollow stopper. A single crystal was placed in the flask approximately 8 cm away from the glass hollow stopper containing a dienophile (2,3-dichloromaleic anhydride, maleic anhydride, N-methylmaleimide, fumarodinitrile, or tetracyanoethylene). The pressure in the flask was reduced to approximately $10^{-1}$ Torr to remove residual volatiles, then heated to 85° C. Reactions were allowed to proceed for up to 3 days. Reacted substrates remained crystalline as determined by X-ray diffraction. Mass spectrometry and X-ray photoelectron spectroscopy (XPS) were used to confirm adsorption of the dienophile on the surface, its chemical identity, and the face selectivity of the reaction.

Example 2

Surface Functionalization of Rubrene Single Crystals

Single crystals of rubrene were prepared and the surface of a rubrene single crystal was functionalized (i.e., the rubrene single crystal was surface-modified) by Diels-Alder reaction with 2,3-dichloromaleic anhydride according to the procedures described in Example 1. X-ray photoelectron spectroscopy (XPS) was used to confirm adsorption of the dienophile on the surface, its chemical identity, and the face selectivity of the reaction.

Example 3

Surface Functionalization of Thin Films

Thin films of tetracene were prepared via rapid sublimation of tetracene sources onto a gold coated glass slide.

The surface of the organic semiconductor thin films was functionalized (i.e., the organic semiconductor thin film is surface-modified) by Diels-Alder reaction with 2,3-dichloromaleic anhydride. Each reaction was performed in a Schlenk round bottom flask equipped with a glass hollow stopper. A substrate carrying a thin film was placed in the flask approximately 8 cm away from the glass hollow stopper containing 2,3-dichloromaleic anhydride. The pressure in the flask was reduced (to approximately $10^{-1}$ Torr) to remove residual volatiles and then heated to 85° C. Reactions were allowed to proceed for up to 3 days. X-ray photoelectron spectroscopy (XPS) was used to confirm reaction of the dienophile on the surface of the thin film.

Example 4

Surface Functionalization of Thin Films for Surface Energy Changes

Thin films of tetracene were prepared on a glass slide using a home built evaporation apparatus at a pressure of $10^{-6}$ Torr. The apparatus consists of a main chamber, roughing pump, turbo pump, pressure gauges, quartz crystal microbalance, and cartridge heater, with a connection to a separate dosing chamber which contains the dienophiles. Both the vacuum gauges, and dosing chamber can be isolated from the main chamber via valves.

The surface of tetracene, measuring 104 nm thick, was reacted with maleic anhydride by opening the valve to the dosing chamber without breaking vacuum, and the vapors of maleic anhydride were allowed to saturate the system. For this reaction, the high vacuum pumps were isolated from the main chamber. After reacting for 3 days, the dosing chamber was isolated via the valve, and a high vacuum was applied for 5 minutes to remove any physisorbed material. The surface energy of the sample was assessed with a goniometer. The contact angle with water was measured to be 68°.

Example 5

Surface Functionalization of Thin Films for Surface Energy Changes

A thin film of tetracene was prepared on a glass slide using the apparatus described in Example 4. The surface of tetracene, measuring 101 nm thick, was reacted with N-hydroxmaleimide by opening the valve to the dosing chamber without breaking vacuum, and the vapors of N-hydroxmaleimide were allowed to saturate the system. For this reaction, the high vacuum pumps were isolated from the main chamber. After reacting for 4 days, the dosing chamber was isolated via the valve, and a high vacuum was applied for 40 minutes to remove any physisorbed material. The surface energy of the sample was assessed with a goniometer. The contact angle with water was measured to be 58-61°.

Example 6

Surface Functionalization of Thin Films for Conductivity Changes

A thin film of pentacene measuring 24 nm in thickness was prepared using the apparatus described in Example 4. The thin film was prepared onto a glass slide coated with octadecyltrichlorosilane and containing a source and drain electrode. The device configuration has a channel width of 1 mm and a length of 40 μm.

The surface of the pentacene film was reacted by first closing the valve to the vacuum pumps and ion gauge, followed by the opening of the dosing valve. The chamber was allowed to saturate with the vapors of N-methylmaleimide. Over the span of 39 hours the current increased from 30 nA to 3.9 μA. The effect persists after the dosing chamber is isolated and the high vacuum is reapplied.

What is claimed:
1. A surface-modified thin film comprising:
    (a) a first layer comprising a polyaromatic organic semiconductor; and:
    (b) a surface layer in direct contact with the first layer, the surface layer comprising an addition reaction product of the polyaromatic organic semiconductor with a compound of formula (II):

$$X=Y \qquad (II)$$

wherein X and Y are, independently, selected from the group consisting of $CR^5R^6$, $NR^7$, O, S, and S=O, or X=Y is a 5- or 6-membered ring having at least one endocyclic double bond selected from the group consisting of a carbon-carbon double bond, a carbon-nitrogen double bond, and a nitrogen-nitrogen double bond; and
    $R^5$, $R^6$, and $R^7$ are independently selected from the group consisting of H, aryl, heteroaryl, alkyl, and an electron-withdrawing group;
    wherein the first layer is substantially free of the addition reaction product of the polyaromatic organic semiconductor with the compound of formula (II).

2. The surface-modified thin film of claim 1, wherein the polyaromatic organic semiconductor is selected from the group consisting of optionally substituted acenes, optionally substituted phenacenes, optionally substituted heterocyclic analogs of acenes, and optionally substituted heterocyclic analogs of phenacenes.

3. The surface-modified thin film of claim 2, wherein the polyaromatic organic semiconductor is an optionally substituted acene represented by formula (I):

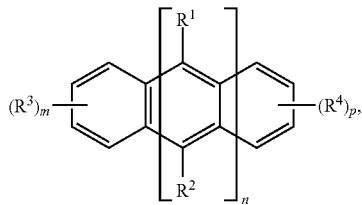

(I)

wherein each $R^1$ and $R^2$ is, independently, selected from the group consisting of H, aryl, heteroaryl, halo, hydroxyl, alkoxy, alkynl, acetyl, cyano, amido, nitro, amino, alklamino, formyl, benzo, naphtho, acetoxy, thiophenyl, alkylthio, cycloalkyl, and alkyl;

n is selected from the group consisting of 1, 2, 3, 4, 5, 6, and 7;

m and p are independently selected from the group consisting of 0, 1, 2, 3, and 4; and each $R^3$ and $R^4$ is, independently, selected from the group consisting of aryl, heteroaryl, halo, hydroxyl, alkoxy, alkynl, acetyl, cyano, amido, nitro, amino, alklamino, formyl, benzo, naphtho, acetoxy, thiophenyl, alkylthio, cycloalkyl, and alkyl.

4. The surface-modified thin film of claim 3, wherein each $R^1$ and $R^2$ is independently selected from the group consisting of H, phenyl, and $C_1$-$C_4$ alkyl.

5. The surface-modified thin film claim 3, wherein each $R^3$ and $R^4$ is independently selected from the group consisting of phenyl and $C_1$-$C_4$ alkyl.

6. The surface-modified thin film of claim 3, wherein the acene is selected from the group consisting of tetracene, pentacene, rubrene, and mixtures thereof.

7. The surface-modified thin film of claim 2, wherein the polyaromatic organic semiconductor is an optionally substituted phenacene represented by formula (VIII) or formula (IX):

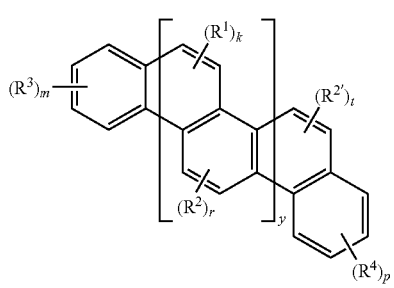

(VIII)

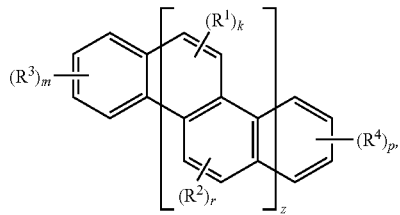

(IX)

wherein each $R^1$, $R^2$, $R^{2'}$, $R^3$, and $R^4$ is, independently, selected from the group consisting of aryl, heteroaryl, halo, hydroxyl, alkoxy, alkynl, acetyl, cyano, amido, nitro, amino, alkylamino, formyl, benzo, naphtho, acetoxy, thiophenyl, alkylthio, cycloalkyl, and alkyl;

y is selected from the group consisting of 0, 1, 2, and 3;

z is selected from the group consisting of 1, 2, and 3;

m and p are independently selected from the group consisting of 0, 1, 2, 3, and 4; and k, r, and t are independently selected from the group consisting of 0, 1, and 2.

8. The surface-modified thin film of claim 7, wherein the phenacene is selected from the group consisting of [3] phenacene, [4] phenacene, [5] phenacene, [6] phenacene, and [7] phenacene.

9. The surface-modified thin film of claim 2, wherein the polyaromatic organic semiconductor is an optionally-substituted heterocyclic analog of an acene or phenacene having one to nine nitrogen atoms or one to nine sulfur atoms in the ring system, and the analog is capable of an addition reaction with the compound of formula (II).

10. The surface-modified thin film of claim 9, wherein the optionally-substituted heterocyclic analog of an acene or phenacene is selected from the group consisting of phenanthrolines, quinolines, pentathienoacene, and mixtures thereof.

11. The surface-modified thin film of claim 1, wherein $R^5$, $R^6$, and $R^7$ are, independently, selected from the group consisting of H, phenyl, $C_1$-$C_4$ alkyl, F, Cl, Br, I, C(=O)R, C(=O)OR, C(=O)NR$_2$, C(=O)Cl, CF$_3$, C≡N, SO$_2$R, SO$_3$R, NR$_3^+$, and NO$_2$; and each R is selected from the group consisting of H, aryl, heteroaryl, and alkyl.

12. The surface-modified thin film of claim 11, wherein each R is selected from the group consisting of H, phenyl, and $C_1$-$C_4$ alkyl.

13. The surface-modified thin film of claim 1, wherein X is $CR^5R^6$.

14. The surface-modified thin film of claim 1, wherein $R^5$ is an electron-withdrawing group.

15. The surface-modified thin film of claim 1, wherein $R^6$ is selected from the group consisting of H, aryl, heteroaryl, and alkyl.

16. The surface-modified thin film of claim 1, wherein X and Y are $CR^5R^6$ and at least one $R^5$ is an electron-withdrawing group.

17. The surface-modified thin film of claim 1, wherein Y is $NR^7$ and $R^7$ is selected from the group consisting of H, aryl, heteroaryl, and alkyl.

18. The surface-modified thin film of claim 1, wherein Y is $NR^7$ and $R^7$ is an electron-withdrawing group.

19. The surface-modified thin film of claim 1, wherein the compound of formula (II) is the 5- or 6-membered ring having at least one endocyclic double bond selected from the group consisting of a carbon-carbon double bond, a carbon-nitrogen double bond, and a nitrogen-nitrogen double bond and is represented by formula (III):

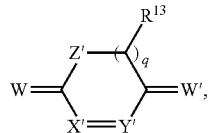

wherein X' and Y' are independently selected from the group consisting of $CR^8$ and N;

Z' is selected from the group consisting of $CR^9R^{10}$, $NR^{11}$, O, S, S=O, and $SO^2$;

W and W' are independently selected from the group consisting of O and $NR^{12}$;

q is 0 or 1;

$R^8$ is selected from the group consisting of H, aryl, heteroaryl, alkyl, and an electron-withdrawing group; and $R^9$, $R^{10}$, $R^{11}$, $R^{12}$, and $R^{13}$ are independently selected from the group consisting of H, aryl, heteroaryl, and alkyl.

20. The surface-modified thin film of claim 19, wherein the compound of formula (II) is represented by formula (IV):

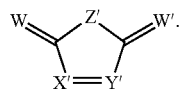

21. The surface-modified thin film of claim 1, wherein the compound of formula (II) is selected from the group consisting of:

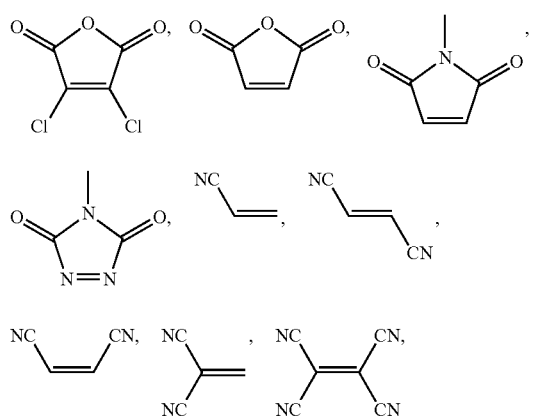

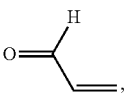

and mixtures thereof.

22. The surface-modified thin film of claim 1, wherein the surface-modified thin film has an average thickness of about 0.5 nm to about 10 microns.

23. A method of preparing the surface-modified thin film of claim 1, comprising:
providing a thin film comprising a polyaromatic organic semiconductor; and
reacting a surface of the thin film with a compound of formula (II) to form a surface-modified thin film.

24. The method of claim 23, wherein the surface-modified thin film has increased conductivity compared to the initial thin film comprising a polyaromatic organic semiconductor.

25. The method of claim 23, wherein the surface-modified thin film has increased surface energy compared to the initial thin film comprising a polyaromatic organic semiconductor.

26. A surface-modified single crystal comprising:
(a) a core comprising a polyaromatic organic semiconductor: and
(b) a coating in direct contact with the core, the coating comprising an addition reaction product of the polyaromatic organic semiconductor with a compound of formula (II):

$$X=Y \quad (II);$$

wherein X and Y are independently selected from the group consisting of $CR^5R^6$, $NR^7$, O, S, and S=O, or X=Y is a 5- or 6-membered ring having at least one endocyclic double bond selected from the group consisting of a carbon-carbon double bond, a carbon-nitrogen double bond, and a nitrogen-nitrogen double bond; and $R^5$, $R^6$, and $R^7$ are independently selected from the group consisting of H, aryl, heteroaryl, alkyl, and an electron-withdrawing group;

wherein the core is substantially free of the addition reaction product of the polyaromatic organic semiconductor with the compound of formula (II).

27. A method of making the surface-modified single crystal of claim 26, comprising:
providing a single crystal comprising a polyaromatic organic semiconductor; and
reacting a surface of the single crystal with a compound of formula (II) to form a surface-modified single crystal.

28. The method of claim 27, wherein the surface-modified single crystal has increased conductivity compared to the initial single crystal comprising a polyaromatic organic semiconductor.

29. The method of claim 27, wherein the surface-modified single crystal has increased surface energy compared to the initial single crystal comprising a polyaromatic organic semiconductor.

* * * * *

UNITED STATES PATENT AND TRADEMARK OFFICE
CERTIFICATE OF CORRECTION

PATENT NO. : 9,991,444 B2  
APPLICATION NO. : 14/476901  
DATED : June 5, 2018  
INVENTOR(S) : Jacob W. Ciszek et al.

Page 1 of 1

It is certified that error appears in the above-identified patent and that said Letters Patent is hereby corrected as shown below:

On the Title Page

At item (71), Lines 1-2, "LOYOLA UNIVERSITY OF CHICAGO, Chicago, IL (US)" should be -- Jacob W. Ciszek, Glenview, IL (US); Brittni A. Qualizza, Chicago, IL (US); Srividya Prasad, Mount Pleasant, MI (US) --.

Signed and Sealed this  
Twenty-sixth Day of August, 2025

Coke Morgan Stewart  
*Acting Director of the United States Patent and Trademark Office*